(12) United States Patent
Shepard

(10) Patent No.: US 9,837,472 B2
(45) Date of Patent: *Dec. 5, 2017

(54) METHOD FOR FORMING PCM AND RRAM 3-D MEMORY CELLS

(71) Applicant: HGST, Inc., San Jose, CA (US)

(72) Inventor: Daniel Robert Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/412,566

(22) Filed: Jan. 23, 2017

(65) Prior Publication Data

US 2017/0133435 A1 May 11, 2017

Related U.S. Application Data

(63) Continuation of application No. 14/967,025, filed on Dec. 11, 2015, now Pat. No. 9,570,516.

(60) Provisional application No. 62/108,643, filed on Jan. 28, 2015.

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/1233* (2013.01); *H01L 45/1683* (2013.01); *H01L 45/06* (2013.01); *H01L 45/08* (2013.01)

(58) Field of Classification Search
CPC ............. H01L 27/2427; H01L 27/2481; H01L 45/1233; H01L 45/1253; H01L 45/1608; H01L 45/1666
See application file for complete search history.

(56) References Cited

U.S. PATENT DOCUMENTS

| | | |
|---|---|---|
| 7,376,008 B2 | 5/2008 | Shepard |
| 8,338,224 B2 | 12/2012 | Yoon et al. |
| 8,507,343 B2 | 8/2013 | Kim |
| 8,755,223 B2 | 6/2014 | Scheuerlein |
| 8,773,881 B2 | 7/2014 | Shepard |
| 8,937,292 B2 | 1/2015 | Bateman |
| 9,679,946 B2 | 6/2017 | Shepard |
| 2009/0134431 A1* | 5/2009 | Tabata .................. G11C 13/00 257/210 |
| 2013/0094273 A1 | 4/2013 | Chien et al. |

* cited by examiner

*Primary Examiner* — Allison P Bernstein
(74) *Attorney, Agent, or Firm* — Patterson & Sheridan, LLP

(57) ABSTRACT

A method for fabricating 3-D cross-point memory arrays, and more particularly to fabricating phase change memory (PCM) and resistive RAM (ReRAM or RRAM) 3-D memory arrays having a cell size footprint of 4F2. The method for forming a plurality of layers of memory cells using a limited number of photolithographic patterning steps is applicable to memory devices having single or multiple storage bits per cell, such as cells having anywhere from one to eight bits per cell or more. These bits are stacked three dimensionally and include memory cells based on phase change material, on resistive change material, on magnetic field alignment, on mechanical switching, and on other memory cells based on other information storage technologies.

20 Claims, 8 Drawing Sheets

METHOD FOR FORMING PCM AND RRAM 3-D MEMORY CELLS

CROSS-REFERENCE TO RELATED APPLICATIONS

This application is a continuation application of co-pending U.S. patent application Ser. No. 14/967,025, filed on Dec. 11, 2015, which claims benefit of U.S. Provisional Patent Application Ser. No. 62/108,643, filed Jan. 28, 2015, which is herein incorporated by reference.

BACKGROUND OF THE DISCLOSURE

Field of the Disclosure

Embodiments of the present disclosure generally relate to the fabrication of 3-D cross-point memory arrays and more particularly, to the fabrication of phase change memory (PCM) and resistive RAM (ReRAM or RRAM) 3-D memory arrays.

Description of the Related Art

There is growing demand for memory devices having ever greater capacity. As advances continue to be made in the area of semiconductor memory devices, high capacity and low cost is increasingly important. Various methods have been proposed to satisfy such requirements, including three-dimensional array structures.

A three-dimensional memory array includes memory cell arrays that are formed on multiple semiconductor material layers. Small memory cells arranged in large arrays that are stacked three dimensionally is an approach to building density. Some techniques for fabricating three-dimensional memory arrays require that each layer be photolithographically patterned and etched increasing the cost of manufacturing. Memory cell designs having a footprint no larger than 4F2 are increasingly desired to provide high density.

Therefore, there is a need for method for fabricating a low cost, high capacity three-dimensional memory array.

SUMMARY OF THE DISCLOSURE

The present disclosure generally relates to the fabrication of 3-D cross-point memory arrays and more particularly, to the fabrication of phase change memory (PCM) and resistive RAM (ReRAM or RRAM) 3-D memory arrays having a cell size footprint of 4F2. The method for forming a plurality of layers of memory cells using a limited number of photolithographic patterning steps is applicable to memory devices having single or multiple storage bits per cell (such as cells having anywhere from one to eight bits per cell or more). These bits are stacked three dimensionally and include memory cells based on phase change material, on resistive change material, on magnetic field alignment, on mechanical switching, and on other memory cells based on other information storage technologies.

In one embodiment, a method of fabricating memory cells is disclosed. The method includes depositing a first layer stack onto a substrate with a plurality of selector contacts, patterning and etching the first layer stack to form a plurality of word lines and to form a plurality of trenches, depositing a first insulating layer within the plurality of trenches, etching a first insulating layer, depositing a metal within the plurality of trenches, patterning and etching the metal to form vertical posts on top of the selector contacts and to form a plurality of holes, depositing a second insulating layer within the plurality of holes, etching the second insulating layer in a biased direction towards a side of each of the plurality of holes, and depositing a conductive material into the plurality of holes.

In another embodiment, a memory device includes a substrate, a first layer stack, a first insulating layer, a plurality of vertical posts that are disposed on the upper surface of selector contacts, a second insulating layer, and a conductive material. The substrate includes a plurality of selector contacts with an upper surface. The second insulating layer is biased towards a first side of each of the vertical posts, and has a top surface that is inclined. The conductive material is biased towards a second side of each of the vertical posts and is the first side.

In another embodiment, a method of fabricating a plurality of layers of memory cells is disclosed. The method includes: (1) depositing layers of conductive material and insulating material for each layer of memory cells, (2) patterning and etching the layers into a plurality of layers of rows, (3) filling between the plurality of layers of rows with a conductive post material that is electrically insulated from the rows, (4) patterning and etching the conductive post material to form a plurality of conductive posts that are separated by holes, and (5) filling the holes with sidewall liners and conductive materials to form a plurality of memory elements.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to a method for fabricating 3-D cross-point memory arrays, and more particularly to fabricating phase change memory (PCM) and resistive RAM (ReRAM or RRAM) 3-D memory arrays having a cell size footprint of 4F2. The method for forming a plurality of layers of memory cells using a limited number of photolithographic patterning steps is applicable to memory devices having single or multiple storage bits per cell, such as cells having anywhere from one to eight bits per cell or more. These bits are stacked three dimensionally and include memory cells based on phase change material, e.g., PRAM or PCM, on resistive change material, on magnetic field alignment, on mechanical switching, and on other memory cells based on other information storage technologies.

However, some approaches to 3-D fabrication require that each layer be photolithographically patterned and etched. In so much as photolithographic steps are costly, a preferred approach is to deposit layers of materials corresponding to a plurality of layers of memory cells and then photographically patterning and etching the entire stack to form the individual layers of memory cells. This approach limits the number of photolithographic steps and thereby the cost of the resulting device. The present disclosure is a method for forming a plurality of layers of memory cells using a limited number of photolithographic patterning steps.

Figure 1:
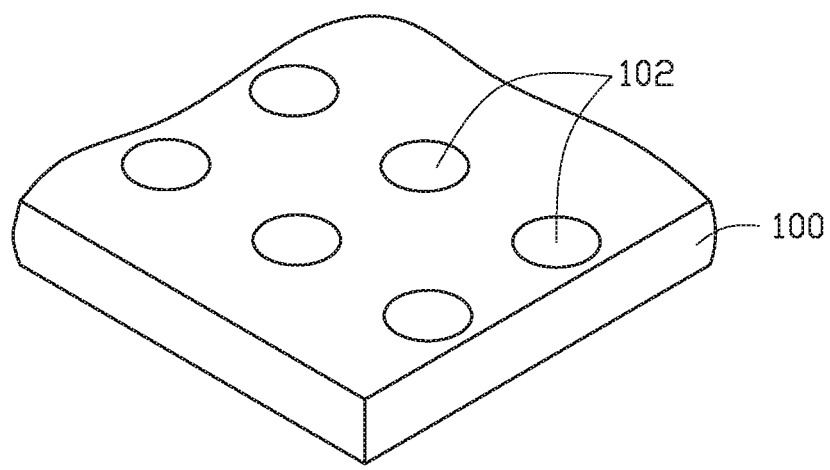
FIG. 1 shows a schematic representation of an initial surface of switched contacts on which one or more layers of memory cells is to be fabricated.

FIG. 1 shows a schematic representation of an initial surface with a portion of an array of selector contacts on which one or more layers of memory cells is to be fabricated. Each selector 102 is one critical feature (F) across and are spaced by one F in both the x and y directions, resulting in an array of selectors 102 that each occupy a 4F2 footprint. The selector contacts 102 are disposed in a wafer 100. In one embodiment, the electronics underlying the selector contact 102 can be a diode (typically one that is vertically constructed), or one of the selectors described in U.S. patent application Ser. No. 61/209,725 or in U.S. Pat. No. 7,376,008. The contacts 102 have a top surface that is relatively planar to the top surface of the wafer 100. It can be imagined that the contacts 102 exposed at the upper surface of the wafer 100 can be made of any fab compatible conductive material. In one embodiment, the contacts 102 could be Tungsten.

Figure 2:
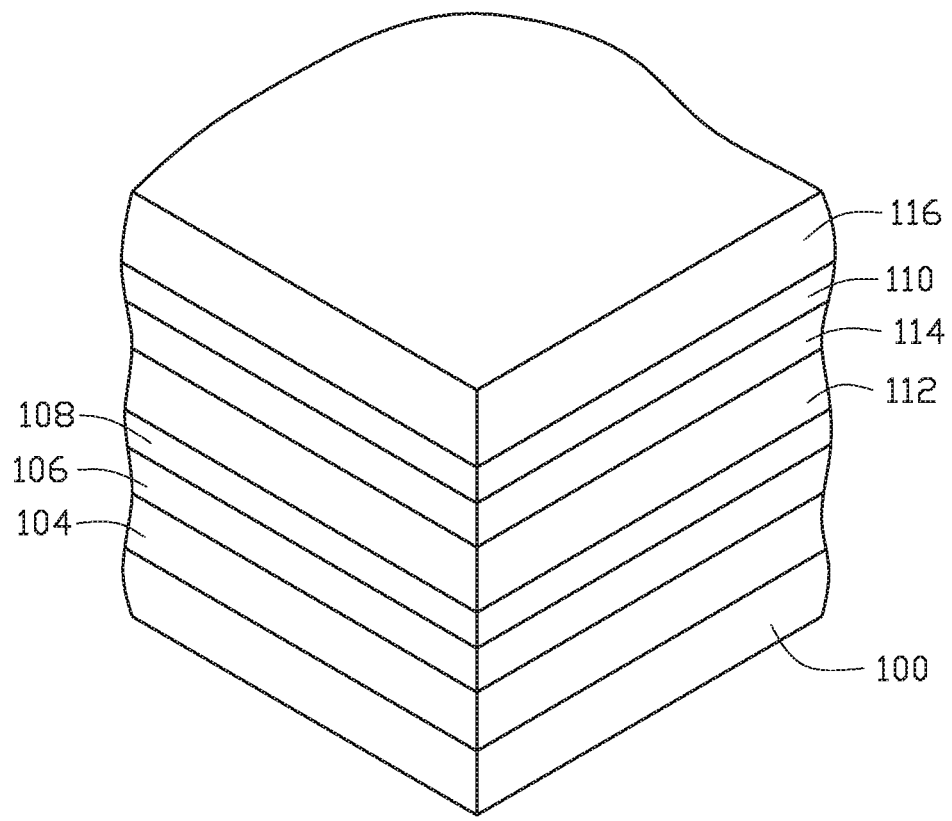
FIG. 2 shows a schematic representation of deposited layers of materials for forming two layers of 3-D memory cells.

FIG. 2 shows the portion of the array following deposition of materials for two layers of ReRAM storage elements. In one embodiment, the array may be made up of a bottom layer of insulating material 104, a ReRAM metal 106 such as platinum, and a layer of metal to form the row conductors such as Tungsten or Aluminum 108. As shown, there are two layerings of materials for two 3-D layers of storage elements. The stack has a first insulating layer 104, a first memory layer 106, a first conductor layer 108, a second insulating layer 112, a second memory layer 114, and a second conductor layer 110. In one embodiment the first insulating layer 104 is disposed on the selector contacts 102, the first memory layer 106 is disposed on the first insulating layer 104, and the first conductor layer 108 is disposed on the first memory layer 106. The number of 3-D layers is limited by the capability of the deposition and etching machinery and their capability to process high aspect ratio features. In one embodiment the 3-D layering process can be repeated to build up the number of 3-D layers a few sets of layers at a time. It can be imagined that the 3-D memory array may be made up of more than 2 layering of materials. In one embodiment, a hard mask material 116 is disposed on top of all the sets of layers. In one embodiment the hard mask material 116 is disposed on the second conductive layer 110.

Figure 3:
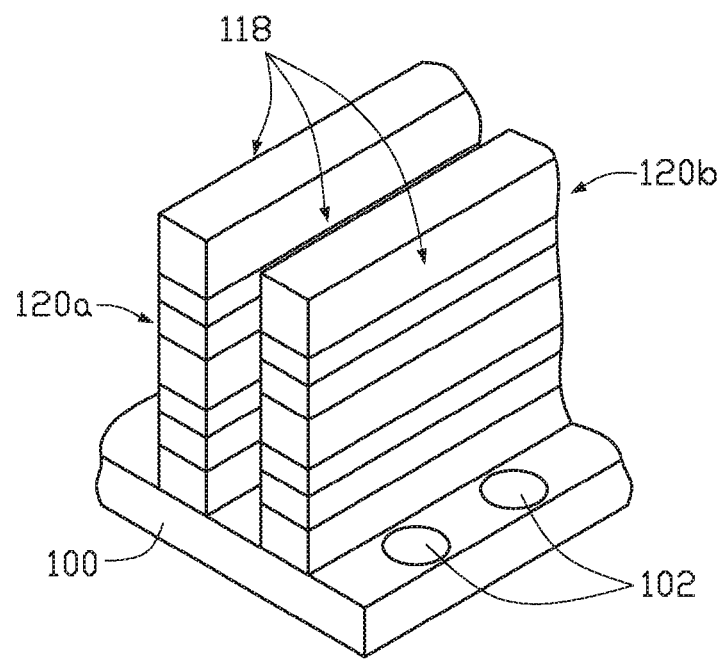
FIG. 3 shows a schematic representation of deposited layers of materials for forming two layers of 3-D memory cells following etching into rows.

FIG. 3 shows the stack of layers after patterning and etching. As is well understood by those skilled in the art of semiconductor fabrication and manufacturing, the hard mask layer 116 disposed on top of the layers would be patterned photolithographically. The layers are patterned into parallel elongated columns with alternating layers of insulating layers, conductor layers, and memory layers. In the etching process, where the material has been removed are left trenches 118. The trenches 118 are etched to expose the selector contacts 102. In one embodiment, etching processes to create the trenches 118 could include etch stop layers and other common deep trench techniques. The elongated columns with alternating layers are 3-D layered word lines 120a, 120b.

Figure 4:
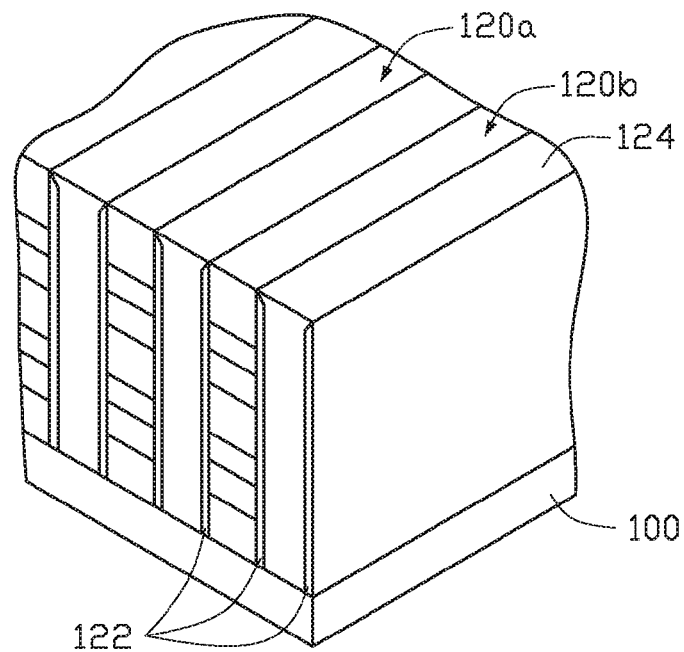
FIG. 4 shows a schematic representation of deposited layers of materials for forming two layers, etched into rows, following deposition of vertical conductor material.

FIG. 4 shows the filling of the trenches 118. In one embodiment, a conformal insulating liner layer 122 is deposited in the trenches 118. The conformal insulating liner layer 122 is then etched back to clear the liner from the bottom of the trench such that the selector contacts 102 are exposed leaving the insulating liner 122 adjacent to the sidewalls of the word lines 120a, 120b, as is well known by those skilled in the art. The trenches 118 are then filled in with a metal. In one embodiment the metal may be Tungsten. The metal will form vertical conductive posts 124. A planarization step such as by CMP or an etch may then be employed to clear the metal from the surface.

Figure 5:
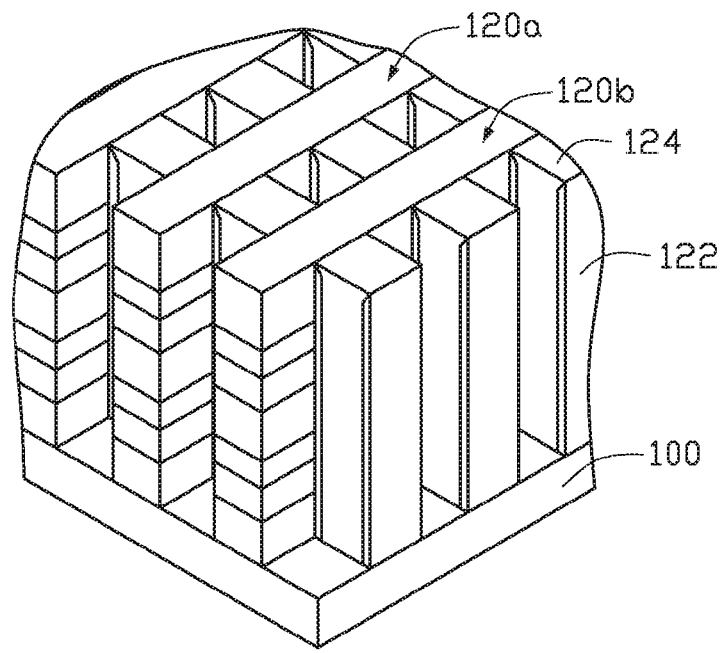
FIG. 5 shows a schematic representation of deposited layers of materials for forming two layers of 3-D memory cells following etch formation of vertical conductors.
Figure 6:
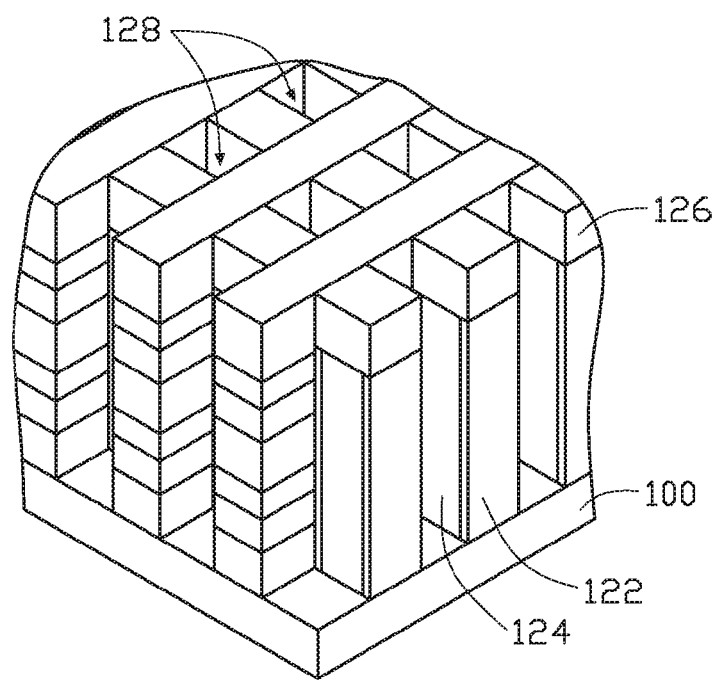
FIG. 6 shows a schematic representation of deposited layers of materials for forming two layers of 3-D memory cells following hard mask capping of vertical conductors.

FIG. 5 shows the formed vertical conductors 124 after undergoing pattern and etch processing. Like the trench 118 etch shown in FIG. 3, a pattern of parallel lines and spaces is photolithographically patterned and etched. In one embodiment, the conductive posts 124 are parallel to each other and orthogonal to the word lines 120a, 120b. The separate individual posts are disposed on top of each of the selector contacts 102. In one embodiment, the tops of the posts can be protected by hard mask material 126, as seen in FIG. 6. In one embodiment, this hard mask feature may be incorporated by photolithographically patterning a pattern of parallel lines and spaces (orthogonal to the pattern used to form the trenches, with photoresist remaining above the spaces between the selector contacts after developing the resist), etching back the metal trench filling material to a depth equal to the thickness desired for the hard mask, and filling the etched recesses by depositing the hard mask material and planarizing. With this hard mask 126 material now in place on top of each desired vertical post 124 location as well as over the 3-D layered word lines 120*a*, 120*b*, an etch would be employed to etch the metal filled trenches into separate, individual, hard mask capped posts each positioned on top of a selector contacts, as seen in FIG. 6.

Referring to FIG. 6, the resulting conductive posts 124 are electrically insulated from the 3-D layered word line row 120*a*, 120*b* conductors 108, 110 formed from the layers of metal by the conformal sidewall insulating liner layer 122. Between the vertical posts 124 are holes 128 that extend downward approximately to the original wafer 100 surface. Each vertical conductive post 124 has metal exposed on two opposing sides of the vertical posts 124. The vertical post 124 has a first surface and a second surface where the first surface of the vertical post 124 is abutting a first surface of a word line. The second surface of the vertical post is orthogonal to the first surface of the word line. The second surface of the vertical post is the surface with the exposed metal. Within a hole 128, there are two exposed surfaces of metal from two different vertical posts 124. The two exposed surfaces of metal are on opposite sides of a hole 128. To prevent two adjacent selectors from both selecting information storage elements formed within a single hole 128, one of the two vertical posts 124 must be electrically insulated.

Figure 7:
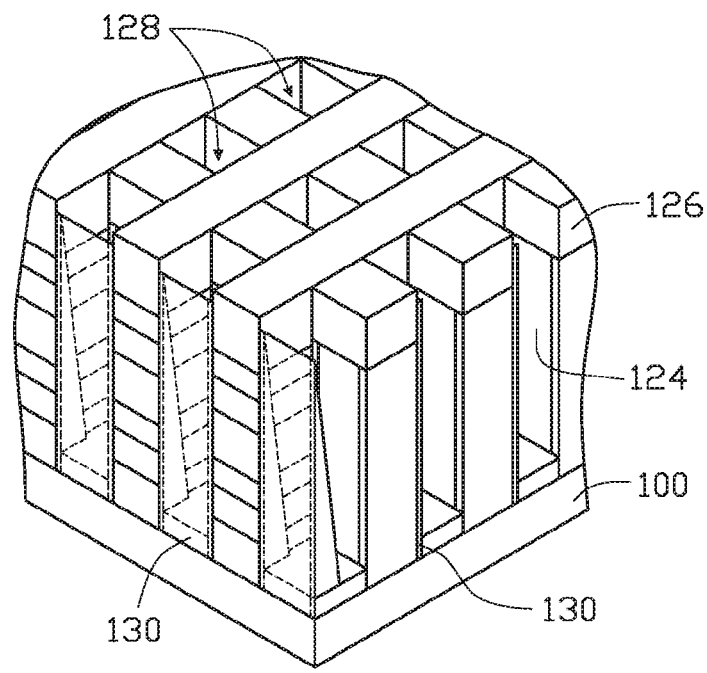
FIG. 7 shows a schematic representation, following vertical post isolation, of the start of a first layer cell formation whereby a contact is made to the vertical conductor.
Figure 13A:
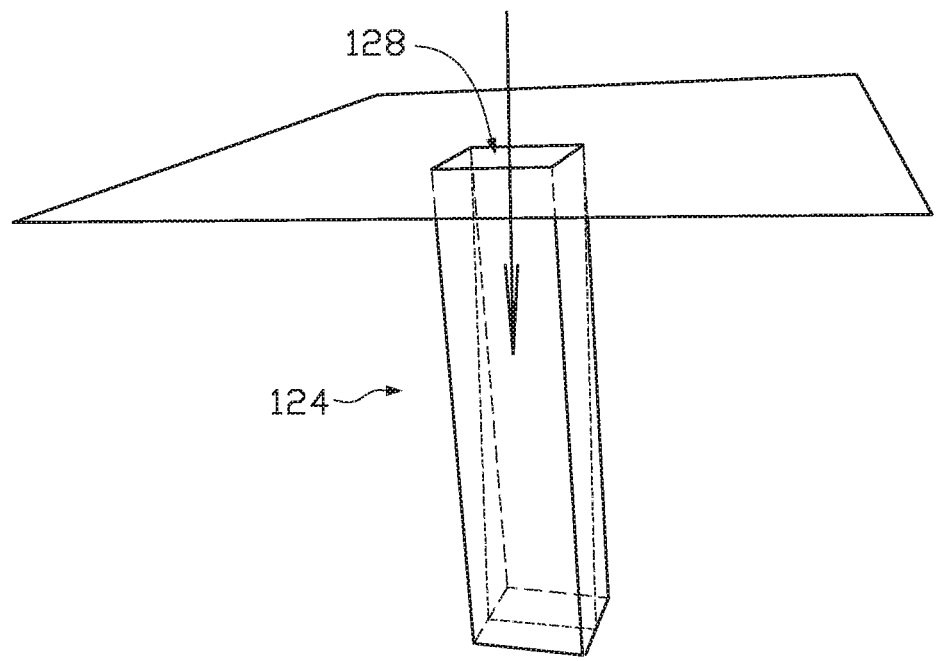
FIG. 13A shows a schematic representation of an etch cantilevered along the wafer's x axis.

As seen in FIG. 7, an insulating, conformal sidewall liner layer 130 is deposited on a surface of vertical post 124 with exposed metal. The liner layer 130 is etched back with the wafer cantilevered such that the etch direction is biased towards one side of the hole. The resulting etch will remove the conformal sidewall liner layer material from the bottom of the hole 128 and from the surface as usual. Because of the cantilevering of the substrate 100, it will also remove the conformal sidewall liner layer from one side of the hole 128 while leaving the conformal sidewall liner layer on the opposite side of the hole 128 thereby exposing the vertical conductive post 124 on one side but leaving the vertical conductive post 124 on the opposite side of the hole 128 covered with insulator 130, as seen in FIG. 13A.

Figure 8:
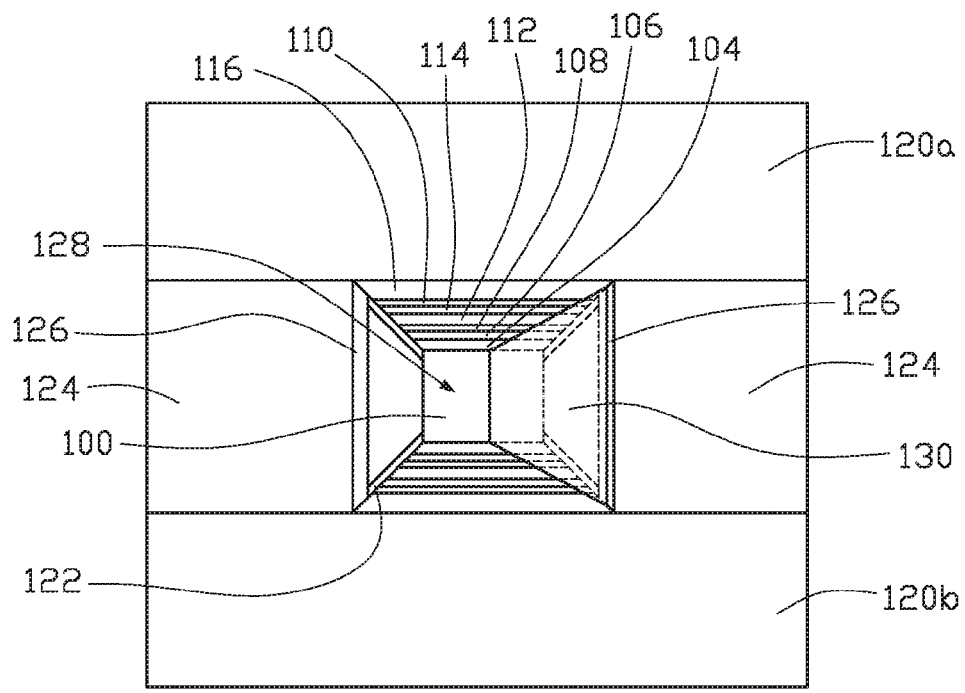
FIG. 8 shows a schematic representation of a top view of a layer cell formation following vertical post isolation.

FIG. 8 shows a schematic top view of one hole 128. The hole 128 is defined by word line 120*a*, word line 120*b*, and two vertical posts 124. Word lines 120*a* and 120*b* are parallel to each other and orthogonal to the vertical posts 124. The different layers of the word lines 120*a* and 120*b* are exposed towards the inside of the hole 128. It should be understood that hole 128 is only a representation of one of the many holes 128 seen in FIG. 7. The conformal side layer or second insulating layer 130 has a top surface that is slanted. The inclined top surface of the second insulating layer 130 is the hypotenuse of a triangle formed by a first side of a vertical post 124, the substrate 100, and the top surface of the second insulating layer 130. By cantilevering the wafer slightly during the directional RIE etch, one side of the hole 128 will be protected by the top surface of the wafer. In one embodiment, after the etching process, the conformal side liner layer 130 extends slanted and vertically down into the hole 128. The conformal side liner layer 130 abuts a first wall of a first vertical post 124 and is opposite the exposed metal of a second vertical post 124. The holes can then be filled with a conductive material which is then etched down so as to leave a lateral conductive contact in the bottom of the hole that is connected to only one of the two adjacent vertical conductive posts 124, as shown in FIG. 7.

Figure 9:
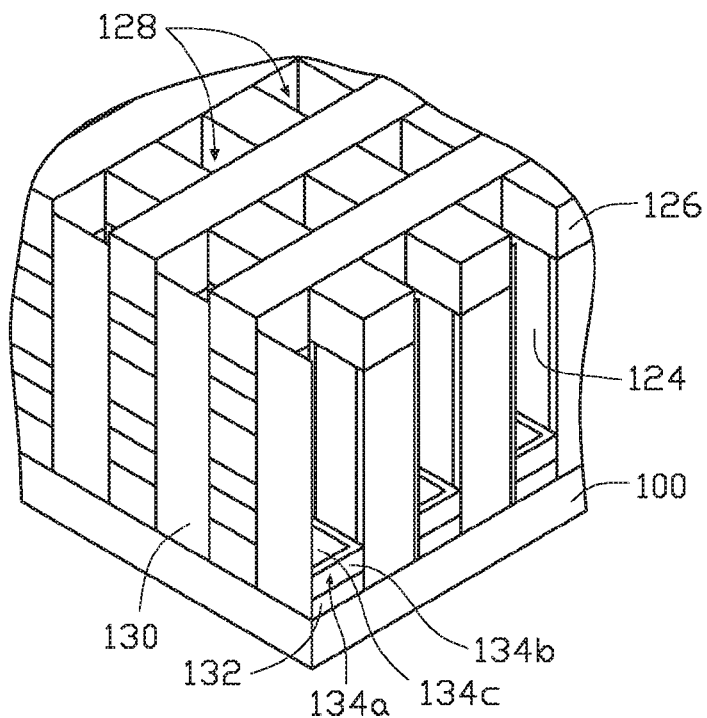
FIGS. 9-12 show a schematic representation of a layer cell formation whereby a select element is formed upon the contact to the vertical conductor.

FIGS. 9-12 show a schematic representation, following vertical post isolation, of a layer cell formation whereby a contact is made to the vertical conductor. This lateral contact 132 is the first component of a small vertical stack of components that make up the information storage element. A next component of the small vertical stack of components is a select device 134*a* such as an Ovonic Threshhold Switch (OTS) and is next deposited in the hole 128. This is done by depositing a conformal insulating liner layer 134*b* such as Silicon Nitride which is then etched back to clear the liner from the top of the lateral conductive contact 132 in the bottom of the hole 128. The hole 128 is then filled with the select device material 134*c* and this material is then etched down to leave a select device layer 134*a* in the bottom of the hole 128 on top of the lateral contact 132, as shown in FIG. 9. This select device is electrically insulated around its sides by the liner material 134*b*.

Figure 10:
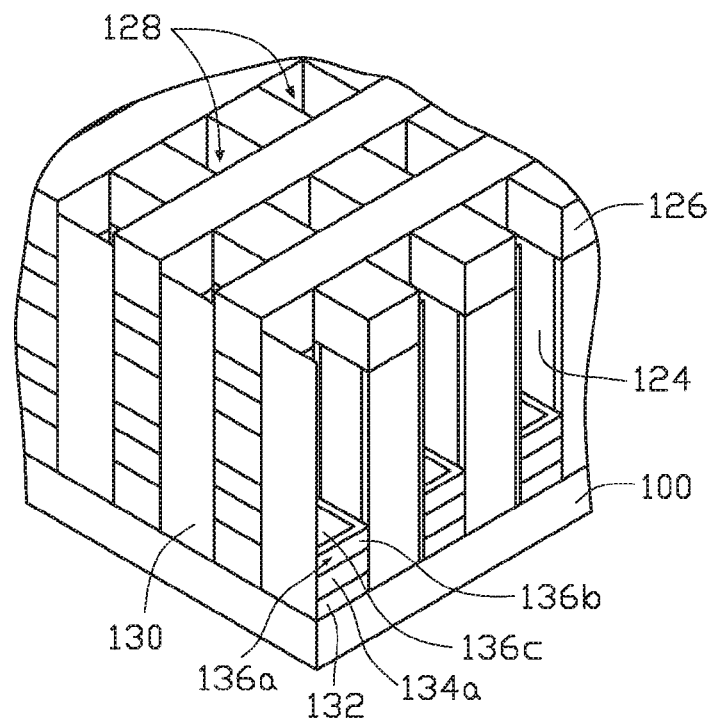
Figure 13B:
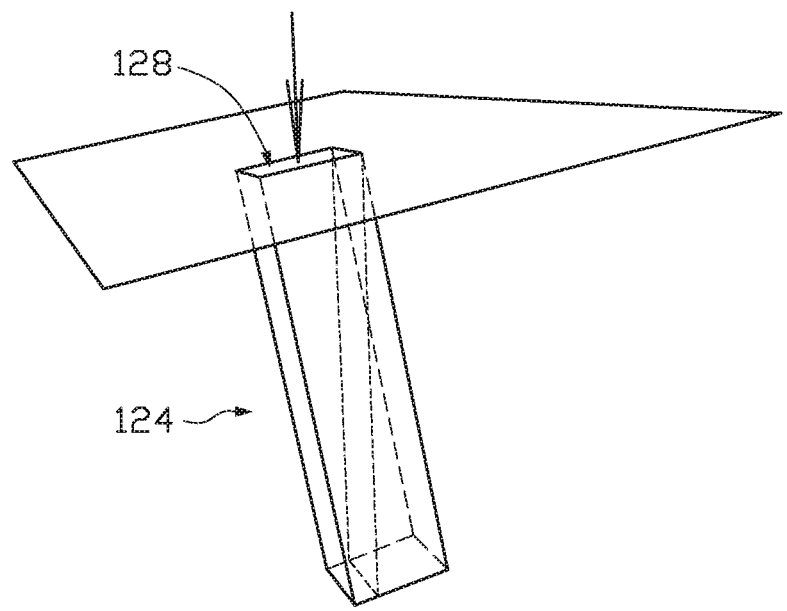
FIG. 13B shows a schematic representation of an etch cantilevered along the wafer's y axis.

FIG. 10 shows the structure after forming the next component of the small vertical stack of components. This component can have different characteristics depending upon the type of information storage element. In one embodiment, if fabricating a 3-D ReRAM type device, this component 136*a* will be a top contact and it would be formed similarly to how the select device 134*a* was formed, except that the center fill material 136*c* is a conductor such as Tungsten (instead of the OTS or similar material) and the conformal insulating liner layer 136*b* material will be a ReRAM oxide material. In this case, this top contact component 136*a* (and all preceding components) would be constructed such that it is vertically aligned with the ReRAM metal 108, 110 described in FIG. 2 so that when operated, the ReRAM filament will be grown from the ReRAM metal 108, 110 into the ReRAM oxide of this liner and to the center fill conductor material. In another embodiment, if fabricating a 3-D PCM type device, this upper contact 136*a* would be the programmable Chalcogenide element and it would be formed just like the select device component 134*a* except that a Chalcogenide material such as GST would be used as the fill material 136*c* in place of the OTS material. Furthermore, an additional component in the form of a top contact would be added to complete the PCM element and this top contact could be formed in a way similar to the bottom lateral contact is formed except that an additional cantilevered etch is performed. This additional etch, seen in FIG. 13B, is performed such that the wafer will be cantilevered in the orthogonal axis direction from its cantilever during the bottom contact etch so as to make a connection to a metal row on only one side of the hole 128.

Figure 13C:
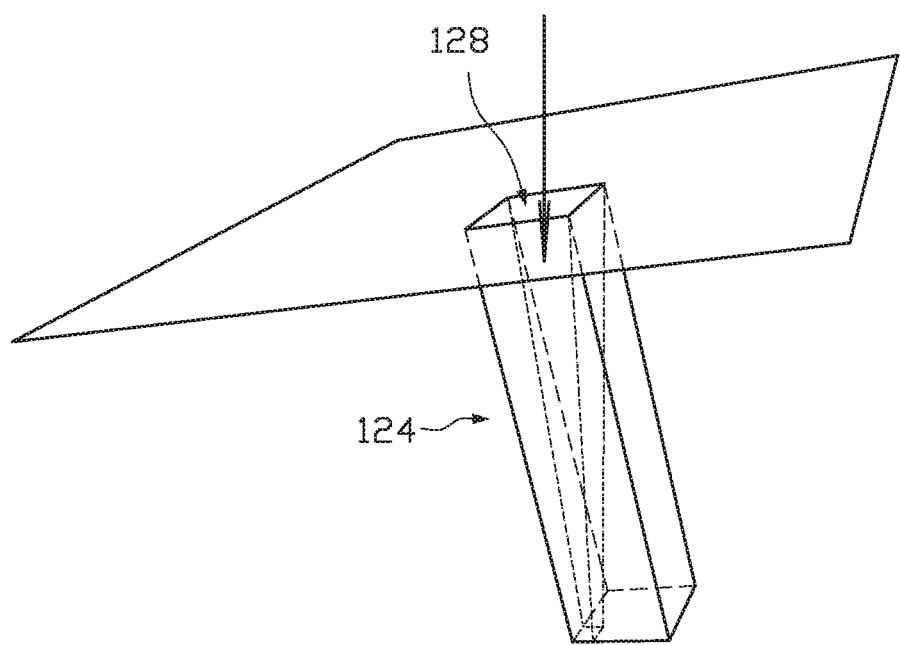
FIG. 13C shows a schematic representation of an etch cantilevered along the wafer's x and y axis.

In other embodiments, additional components to the small vertical stack of components can be included in similar fashion to act as barrier layers, thermal insulation layers, and the like. In a different embodiment, the stack could include forming the bottom lateral contact using a ReRAM metal fill material and a ReRAM liner material (in first operation, a ReRAM filament would be grown to connect the ReRAM metal of the center fill material to one of the two the vertical posts to create a circuit path). In another embodiment, the stack could include forming the top lateral contact in the same way that that a ReRAM top contact is formed. However, in first operation, a ReRAM filament would be grown to connect the ReRAM metal to the center fill material to create a circuit path. Since PCM is operated with a unidirectional current, the filament will never be reversed. In another embodiment, the cantilever etch can be performed in two stages, as seen in FIG. 13C. First etching the vertical post 124 with the cantilevering in the x and y directions is performed followed by cantilevering in the x and negative y directions. The effect of a two stage cantilever etch is to better ensure that the two sides adjacent to the side being etched clear will have insulating material remaining. The first stage etch will clear material from the front and left sidewalls; this etch is timed to remove half or slightly more from the sidewalls. The second stage etch will clear material from the front and right sidewalls; this etch is also timed to remove half or slightly more from the sidewalls. The net effect will be to remove all of the front sidewall material while leaving at least a portion of the sidewall material on both the left and right sidewalls.

Figure 11:
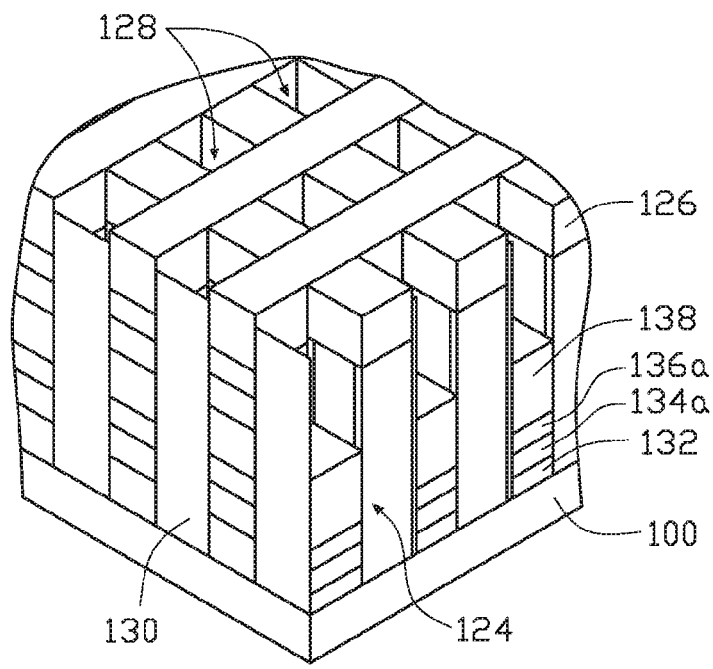
Figure 12:
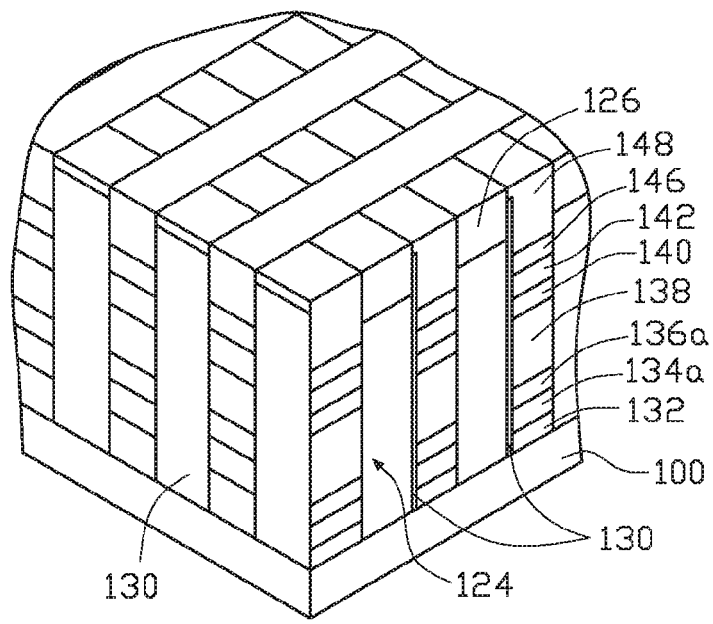

Following the formation of the small vertical stack of components that would make up one 3-D level information storage element, a layer of dielectric material 138 would be deposited and etched back, as seen in FIG. 11. In one embodiment, the small vertical stack of components that would make up one 3-D level information storage element includes the lateral conductive contact 132, the select device layer 134a, and the top contact component 136a. Additional 3-D levels can be incorporated by repeating the sequence of steps used to form the first small vertical stack of components for each additional 3-D level element, as seen in FIG. 12. As way of example, the stack could include a first lateral conductive contact 132, a first select device layer 134a, a first top contact component 136a, a first dielectric material 138, a second lateral conductive contact 140, a second select device layer 142, a second top contact component 146, and a second dielectric material layer 148. Upon completion of the layers of information storage elements, the ends of the word lines 120a, 120b can be connected to driver circuits in accordance with the techniques disclosed in U.S. patent application Ser. No. 62/041,306.

The present disclosure has a few innovations for fabricating 3-D memory arrays with very few photolithography steps. First, the word lines are formed by depositing a plurality of layers and then etching through the plurality of layers so as to form all of the vertically stacked word lines in the 3-D layers with one photo step (leaving trenches). Second, the vertical post conductors are formed by filling the etched trenches between the layers of word lines with conductor material (with an electrical insulator lining) and etching across the filled trenches to form individual posts (leaving holes). Third, each memory element is a small vertical stack of components and is 3-D layered in the holes where each component consists of a core material surrounded by a liner material. The liner material may be breached on one or more sides by cantilevered etching, unidirectional electro-migration after manufacture, or the like.

The foregoing description of an example of the preferred embodiment of the disclosure and the variations thereon have been presented for the purposes of illustration and description. It is not intended to be exhaustive or to limit the disclosure to the precise forms disclosed. Many modifications and variations are possible in light of the above teaching. It is intended that the scope of the disclosure be limited not by this detailed description, and the scope thereof is determined by the claims that follow.

What is claimed is:

1. A method of fabricating memory cells, comprising:
    patterning and etching a metal to form a vertical post over a substrate and to form a plurality of holes;
    depositing a second insulating layer within the plurality of holes;
    etching the second insulating layer, wherein the etched second insulating layer has a top surface that is slanted; and
    depositing a conductive material into the plurality of holes.

2. The method of claim 1, wherein the metal is disposed over a first layer stack that comprises:
    a first insulating layer;
    a first memory layer;
    a first conductor layer;
    a second insulating layer;
    a second memory layer; and
    a second conductor layer.

3. The method of claim 2, wherein the first layer stack further comprises: a first hard mask layer.

4. The method of claim 3, wherein the first insulating layer is deposited onto a first side of a word line and a second side of the word line.

5. The method of claim 4, wherein the first side of a word line is opposed to the second side of the word line.

6. The method of claim 5, wherein the first side of a word line and the second side of a word line are facing the plurality of trenches.

7. The method of claim 1, further comprising cantilevering the substrate during the etching of the second dielectric layer.

8. A memory device, comprising:
    a substrate, wherein the substrate includes a plurality of selector contacts and wherein the selector contacts have an upper surface;
    a first layer stack;
    a first insulating layer;
    a vertical post, wherein the vertical posts are disposed on the upper surface of the selector contacts;
    means for angling a conductive material adjacent the vertical post; and
    the conductive material.

9. The memory device of claim 8, wherein the first layer stack comprises:
    a first insulating layer;
    a first memory layer;
    a first conductor layer;
    a second insulating layer;
    a second memory layer; and
    a second conductor layer.

10. The memory device of claim 9, wherein the first layer stack further comprises: a hard mask layer.

11. The memory device of claim 10, wherein the first insulating layer is disposed adjacent the vertical posts orthogonal to the second insulating layer.

12. The memory device of claim 8, wherein the first insulating layer is disposed adjacent the vertical posts orthogonal to the second insulating layer.

13. The memory device of claim 8, further comprising a hard mask layer over the vertical posts.

14. The memory device of claim 8, wherein the vertical posts are Tungsten.

15. A method of fabricating a plurality of layers of memory cells comprising the steps of:
    patterning and etching conductive post material to form a plurality of conductive posts that are separated by holes; and
    filling the holes with sidewall liners;
    cantilevering the sidewall liners;
    etching the sidewall liners to form openings; and
    depositing conductive materials in the openings to form a plurality of memory elements.

16. The method of claim 15, further comprising the step of electrically connecting a conductive material in a hole with the conductive post material of a conductive post.

17. The method of claim 16, wherein the cantilevering comprises preferentially etching one side of the sidewall liner over the opposite side of the sidewall liner.

18. The method of claim 15, further comprising depositing a metal suitable for forming a Resistive RAM.

19. The method of claim 15, further comprising depositing an oxide suitable for forming a Resistive RAM.

20. The method of claim 15, further comprising depositing a Chalcogenide alloy suitable for forming a Phase-change memory cell.

* * * * *